United States Patent
Delshadpour et al.

(10) Patent No.: US 10,812,067 B1
(45) Date of Patent: Oct. 20, 2020

(54) REDRIVER AND RESISTIVE UNIT FOR A REDRIVER

(71) Applicant: NXP B.V., Eindhoven (NL)

(72) Inventors: Siamak Delshadpour, Phoenix, AZ (US); Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/435,413

(22) Filed: Jun. 7, 2019

(51) Int. Cl.
*H03K 17/687* (2006.01)
*H03H 11/02* (2006.01)
*H03K 17/60* (2006.01)

(52) U.S. Cl.
CPC .......... *H03K 17/687* (2013.01); *H03H 11/02* (2013.01); *H03K 17/60* (2013.01)

(58) Field of Classification Search
CPC ....... H03K 17/687; H03K 17/60; H03H 11/02
See application file for complete search history.

(56) References Cited

U.S. PATENT DOCUMENTS

| 4,625,271 | A | 11/1986 | Chetty et al. |
| 5,347,538 | A * | 9/1994 | Marbot ............... H03K 5/026 330/307 |
| 7,009,827 | B1 | 3/2006 | Lee et al. |
| 2017/0102413 | A1 * | 4/2017 | Liu ............... G01R 19/16571 |

OTHER PUBLICATIONS

Delshadpour, Siamak et al. "Low Power 20.625 Gbps Type-C USB3.2/DP1.4/Thurderbolt3 Combo Linear Redriver in 0.25 μm BiCMOS Technology", IEEE International System-on-Chip Conference (SOCC), pp. 326-329, 2018.

* cited by examiner

*Primary Examiner* — John W Poos

(57) ABSTRACT

Embodiments of redrivers and resistive units for redrivers are disclosed. In an embodiment, a resistive unit for a redriver includes at least one resistor connected to an input/output terminal of the redriver, at least one switch serially connected to the at least one resistor, and a voltage regulator connected to the at least one switch and configured to generate a termination voltage for the at least one switch. Instead of grounding the at least one resistor, using the voltage regulator can avoid large voltage jump at input/output terminals to keep connected devices safe.

20 Claims, 4 Drawing Sheets

REDRIVER AND RESISTIVE UNIT FOR A REDRIVER

BACKGROUND

A redriver can be used to provide signal amplification and/or waveform shaping such that a transmitted signal behaves as intended over long channels. For example, a redriver can be used to reduce insertion loss. Generally, a redriver supports multiple operational modes. However, switching between different operational modes may cause an abrupt voltage change at one or more input terminals and/or output terminals of the redriver. Typically, an input/output terminal of a redriver is electrically connected to a decoupling capacitor with a large capacitance value, which can isolate the direct current (DC) level of the redriver input/output from an Integrated Circuit (IC) chip electrically connected to the redriver that is situated before or after the redriver in the signal path. Because of the large capacitance value of the decoupling capacitor, an abrupt voltage change at an input/output terminal of a redriver can damage the connected IC chip if the absolute maximum voltage of the IC chip is lower than a voltage at the input/output terminal as a result of the abrupt voltage change. Therefore, there is a need for a redriver that can switch between different operational modes without causing an abrupt voltage change at input/output terminals of the redriver.

SUMMARY

Embodiments of redrivers and resistive units for redrivers are disclosed. In an embodiment, a resistive unit for a redriver includes at least one resistor connected to an input/output terminal of the redriver, at least one switch serially connected to the at least one resistor, and a voltage regulator connected to the at least one switch and configured to generate a termination voltage for the at least one switch. Other embodiments are also described.

In an embodiment, the voltage regulator is further configured to generate the termination voltage for the at least one switch in response to a supply voltage of the redriver.

In an embodiment, the termination voltage is lower than the supply voltage of the redriver and is higher than a reference voltage.

In an embodiment, the reference voltage is zero volts.

In an embodiment, the voltage regulator includes a diode device connected to a DC voltage, a second resistor connected between the diode device and a reference voltage, and a voltage output terminal connected to the diode device and to the second resistor and configured to output the termination voltage to the at least one switch.

In an embodiment, the DC voltage is equal to a supply voltage of the redriver.

In an embodiment, the termination voltage is lower than the supply voltage of the redriver and is higher than the reference voltage.

In an embodiment, the reference voltage is zero volts.

In an embodiment, the resistive unit further includes a capacitor connected to the diode device, to the second resistor, and to the voltage output terminal.

In an embodiment, the diode device includes a transistor.

In an embodiment, a resistive unit for a redriver includes first and second resistors connected to an input/output terminal of the redriver, first and second switches serially connected to the first and second resistors respectively, and a voltage regulator connected to the first and second switches and configured to generate a DC termination voltage for the first and second switches in response to a DC supply voltage of the redriver, where the termination voltage is lower than the DC supply voltage of the redriver and is higher than a DC reference voltage.

In an embodiment, the voltage regulator includes a diode device connected to the DC supply voltage of the redriver, a third resistor connected between the diode device and the DC reference voltage, and a voltage output terminal connected to the diode device and to the third resistor and configured to output the DC termination voltage to the first and second switches.

In an embodiment, the DC reference voltage is zero volts.

In an embodiment, the resistive unit further includes a capacitor connected to the diode device, to the third resistor, and to the voltage output terminal.

In an embodiment, the diode device includes a transistor.

In an embodiment, a redriver includes a Continuous Time Linear Equalizer (CTLE) configured to perform signal equalization, a transmitter driver configured to generate a driver signal in response to the signal equalization, a first resistive unit connected to the CTLE or to the transmitter driver and to an input/output terminal of the redriver, and a second resistive unit connected to the CTLE or the transmitter driver and to the input/output terminal of the redriver. The first resistive unit includes first and second resistors connected to the input/output terminal of the redriver, first and second switches serially connected to the first and second resistors respectively, and a voltage regulator connected to the first and second switches and configured to generate a DC termination voltage for the first and second switches in response to a DC supply voltage of the redriver, where the termination voltage is lower than the DC supply voltage of the redriver and is higher than a DC reference voltage. The second resistive unit includes third and fourth resistors connected to the input/output terminal of the redriver and third and fourth switches serially connected to the third and fourth resistors respectively and to the DC supply voltage of the redriver.

In an embodiment, the voltage regulator includes a diode device connected to the DC supply voltage of the redriver, a fifth resistor connected between the diode device and the DC reference voltage, and a voltage output terminal connected to the diode device and to the fifth resistor and configured to output the DC termination voltage to the first and second switches.

In an embodiment, the redriver further includes a capacitor connected to the diode device, to the fifth resistor, and to the voltage output terminal.

In an embodiment, the diode device includes a transistor.

In an embodiment, the DC reference voltage is zero volts.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
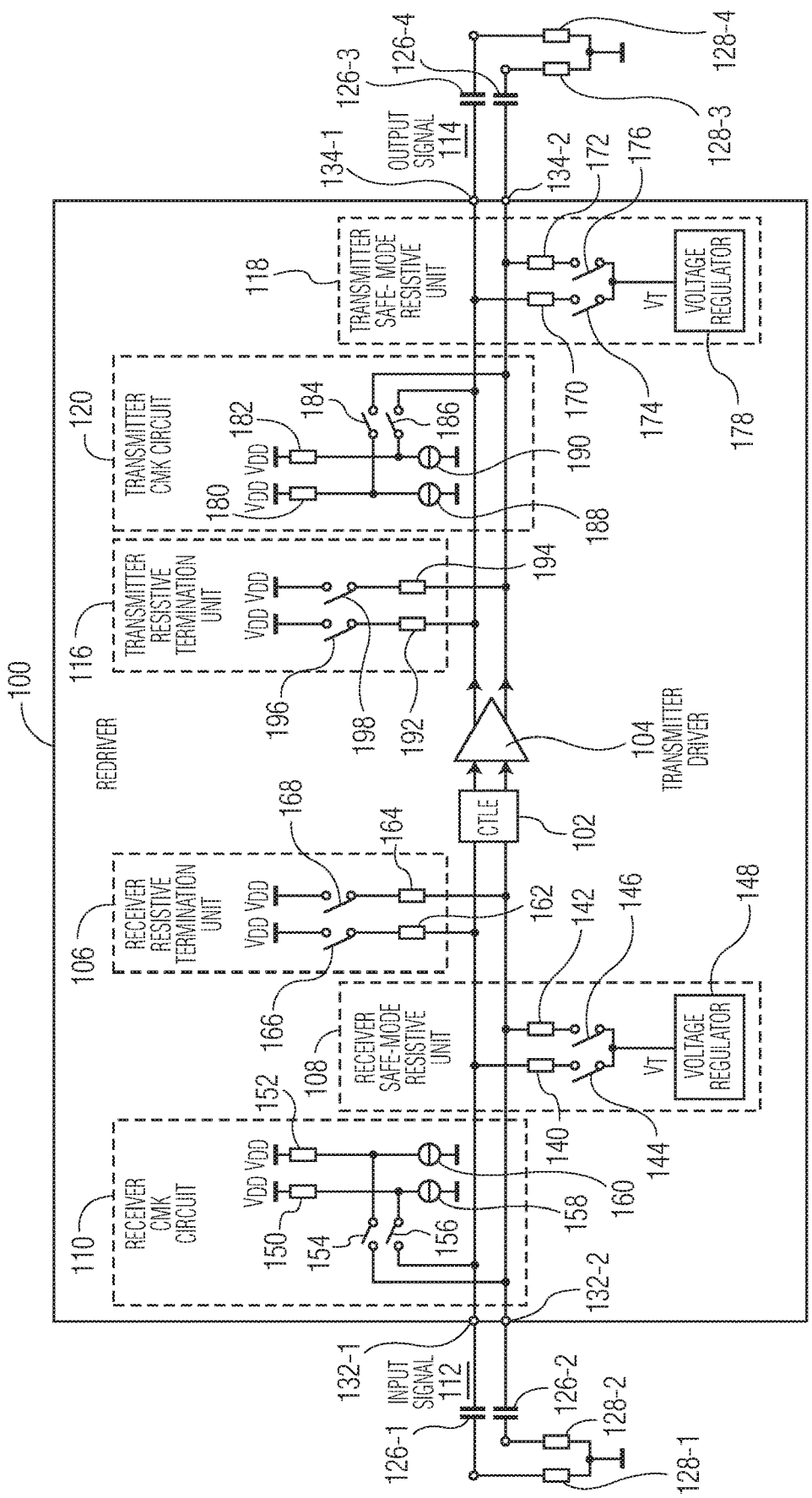
FIG. 1 is a schematic block diagram of a redriver in accordance with an embodiment of the invention.

FIG. 1 is a schematic block diagram of a redriver 100 in accordance with an embodiment of the invention. The redriver can be used to provide signal amplification and/or waveform shaping such that a transmitted signal behaves as intended over long channels. For example, the redriver can be used to reduce insertion loss and/or to address other signal integrity challenge. In the embodiment depicted in FIG. 1, the redriver generates a desired output signal 114 in response to an input signal 112. The redriver can be used in various applications, such as automotive applications, communications applications, industrial applications, medical applications, computer applications, and/or consumer or appliance applications. For example, the redriver can be used in Universal Serial Bus (USB), Thunderbolt (TBT), DisplayPort (DP), and/or CIO applications. In the embodiment depicted in FIG. 1, the redriver includes a Continuous Time Linear Equalizer (CTLE) 102, a transmitter driver 104, a receiver resistive termination unit 106, a receiver safe-mode resistive unit 108, a receiver Common Mode Keeper (CMK) circuit 110, a transmitter resistive termination unit 116, a transmitter safe-mode resistive unit 118, and a transmitter CMK circuit 120. In some embodiments, the redriver is a linear redriver that matches the incoming waveform with an outgoing waveform. In other embodiments, the redriver is a limiting (non-linear) redriver that an outgoing waveform does not exactly match the incoming waveform. In the embodiment depicted in FIG. 1, the redriver is electrically connected to decoupling capacitors 126-1, 126-2, 126-3, 126-4 and resistors 128-1, 128-2, 128-3, 128-4, which are connected to a reference voltage such as ground. In some embodiments, at least one of the decoupling capacitors 126-1, 126-2, 126-3, 126-4 has a capacitance value that is in the range of 100 nF and at least one of the resistors 128-1, 128-2, 128-3, 128-4 has a resistance value that is in the range of 200K ohms. In some embodiments, the redriver is implemented in a substrate and is packaged as a stand-alone semiconductor IC device or chip. In these embodiments, the decoupling capacitors and the resistors are external to the redriver. In some embodiments, the redriver is included in a computing device, such as a smartphone, a tablet computer, a laptop, etc. In some embodiments, at least some of the components of the redriver are implemented in a substrate, such as a semiconductor wafer or a printed circuit board (PCB). In an embodiment, at least some of the components of the redriver are packaged as a stand-alone semiconductor IC chip. Although the redriver is shown in FIG. 1 as including certain circuit elements, in other embodiments, the redriver may include one or more additional circuit elements. For example, the redriver may include more than two CMK circuits or less than two CMK circuits in other embodiments. In another example, the redriver may include the decoupling capacitors in other embodiments.

In the embodiment depicted in FIG. 1, the redriver 100 supports multiple operational modes. Examples of the operational modes supported by the redriver include, without being limited to, a power saving operational mode, a safe state operational mode, a USB operational mode, a DP operational mode, a TBT operational mode, a CIO operational mode, and a far-end termination detect operational mode. Switching between different operational modes in the redriver may cause an abrupt voltage change at one or more input terminals 132-1, 132-2 and/or output terminals 134-1, 134-2 of the redriver. Because the capacitance values of the decoupling capacitors 126-1, 126-2, 126-3, 126-4 are typically large (e.g., in the range of 100 nF or more), an abrupt voltage change at an input/output terminal of the redriver can damage an electronic device such as an IC chip that is before or after the redriver in the signal path if the absolute maximum voltage of the electronic device is lower than a voltage at the input/output terminal as a result of the abrupt voltage change. In the embodiment depicted in FIG. 1, the redriver can switch between different operational modes without causing an abrupt voltage change at input/output terminals of the redriver, because the transmitter safe-mode resistive unit and the receiver resistive termination unit are terminated at a voltage that is lower than the direct current (DC) supply voltage, $V_{DD}$, of the redriver, as further explained below.

In the embodiment depicted in FIG. 1, the CTLE 102 is configured to perform signal equalization on the input signal 112. The CTLE can be implemented using known architectures. In some embodiments, the CTLE is used with an input buffer before it and multiple amplifiers with different gains. For example, the CTLE may include an amplifier with a low frequency gain and an amplifier with a peaking gain to shape the required alternating current (AC) response or equalization.

In the embodiment depicted in FIG. 1, the transmitter driver 104 is configured to generate a driver signal in response to the signal equalization performed by the CTLE 102. The transmitter driver may be implemented by one or more PNP transistors, one or more PMOS transistors, one or more NPN transistors, and/or one or more NMOS transistors. In implementations in which the transmitter driver is implemented using an NPN transistor or an NMOS transistor, 50-ohm termination resistors may be terminated into the DC supply voltage, $V_{DD}$, of the redriver 100 instead of terminated into a reference voltage such as ground.

Figure 2:
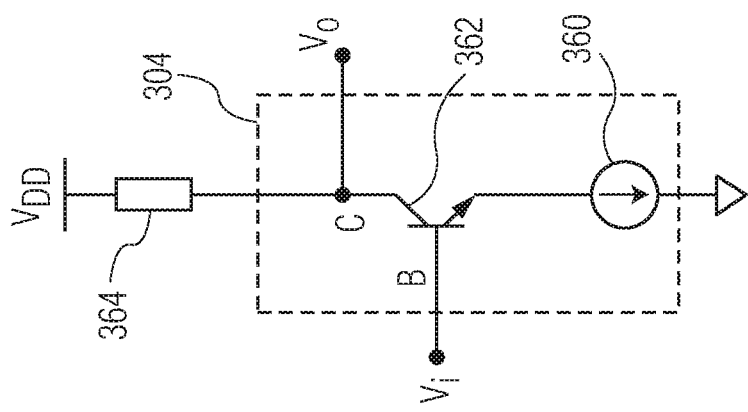
FIGS. 2 and 3 depict two embodiments of a transmitter driver of the redriver depicted in FIG. 1 in single-ended form.
Figure 3:
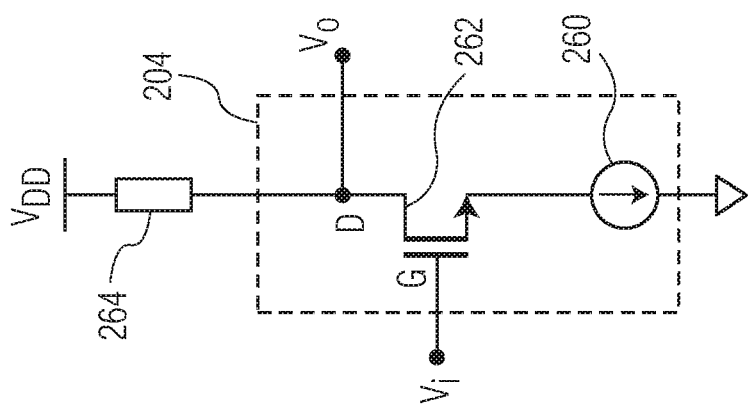

FIG. 2 depicts an NMOS transistor based transmitter driver 204 and FIG. 3 depicts a NPN transistor based transmitter driver 304. The transmitter drivers depicted in FIGS. 2 and 3 are embodiments of the transmitter driver 104 depicted in FIG. 1 in single-ended form. However, the transmitter driver 104 depicted in FIG. 1 is not limited to the embodiments shown in FIGS. 2 and 3. In the embodiment depicted in FIG. 2, the transmitter driver 204 includes a current source 260 connected to a reference voltage such as ground and an NMOS transistor 262 connected to the DC supply voltage, $V_{DD}$, of the redriver 100 through a termination resistor 264 of, for example, 50 ohm. An input voltage, $V_i$, is input into a gate terminal, G, of the NMOS transistor and an output voltage, $V_o$, is input into a drain terminal, D, of the NMOS transistor. In the embodiment depicted in FIG. 3, the transmitter driver includes a current source 360 connected to a reference voltage such as ground and an NPN transistor 362 connected to the DC supply voltage, $V_{DD}$, of the redriver through a termination resistor 364 of, for example, 50 ohm. An input voltage, $V_i$, is input into a base terminal, B, of the NPN transistor and an output voltage, $V_o$, is input into a collector terminal, C, of the NPN transistor.

During a switch between different operational modes such as between a safe operational mode and a USB operational mode, termination resistor switches are enabled. In an embodiment, because load resistance can be around 200 k ohm and the resistance values of termination resistors are typically 50 ohm, the voltage at the output terminals 134-1, 134-2 of the redriver 100 is almost at the voltage level of the DC supply voltage, $V_{DD}$, of the redriver 100. Because the capacitance value of the decoupling capacitors is typically large (e.g., in the range of 100 nF or more), the voltage jump can be directly transferred to a load device, which can cause damage to the load device.

In the redriver 100 depicted in FIG. 1, each of the receiver safe-mode resistive unit 108 and the transmitter safe-mode resistive unit 118 are terminated to a DC termination voltage, $V_T$, which is close to the DC supply voltage, $V_{DD}$, of the redriver 100 instead of ground. For example, the DC termination voltage may be around 1.2 volt (e.g., within ±30% of 1.2 volt) and the DC supply voltage, $V_{DD}$, of the redriver may be around 1.8 volt (e.g., within ±10% of 1.8 volt). When the receiver safe-mode resistive unit and the transmitter safe-mode resistive unit are terminated to ground, a voltage change of around 1.8 volt (i.e., zero volt to around 1.8 volt, the DC supply voltage, $V_{DD}$, of the redriver), is presented at an input/output terminal 132-1, 132-2, 134-1, or 134-2 of the redriver, during a switch between different operational modes in the redriver. However, when the receiver safe-mode resistive unit and the transmitter safe-mode resistive unit are terminated to the DC termination voltage, a voltage change of 0.6 volt (i.e., 1.2 volt to 1.8 volt, the DC supply voltage, $V_{DD}$, of the redriver), is presented at an input/output terminal of the redriver, during a switch between different operational modes in the redriver. Consequently, the magnitude of a voltage change at input/output terminals of the redriver caused by switching between different operational modes in the redriver is reduced. In some implementation, the receiver CMK circuit 110 and the transmitter CMK circuit 120 are kept on in order to reduce voltage swing at an input/output terminal of the redriver during a switch between different operational modes. However, the current consumption of the receiver CMK circuit and the transmitter CMK circuit can be high. For example, for a 4-channel redriver, a current of around 80-200 microampere (µA) can be consumed, which is higher than the current threshold for a power saving mode. Compared to a redriver implementation in which the receiver CMK circuit and the transmitter CMK circuit are kept on, terminating the receiver safe-mode resistive unit and the transmitter safe-mode resistive unit to the DC termination voltage, $V_T$, which is close to the DC supply voltage, $V_{DD}$, of the redriver does not result in the same spike of the current consumption. For example, terminating the receiver safe-mode resistive unit and the transmitter safe-mode resistive unit to the DC termination voltage, $V_T$, may result in 1 µA current increase in any operational mode of the redriver. Consequently, the redriver in the embodiment depicted in FIG. 1 can be used in a power saving mode.

In the embodiment depicted in FIG. 1, the receiver safe-mode resistive unit 108 is electrically connected to the CTLE 102 and to the input terminals 132-1, 132-2 of the redriver 100. In some embodiments, the receiver safe-mode resistive unit is used to show a minimum impedance the redriver is turned off. The receiver safe-mode resistive unit includes two resistors 140, 142 electrically connected to the input terminals 132-1, 132-2 of the redriver, two switches 144, 146 serially connected to the resistors 140, 142, and a voltage regulator 148 electrically connected to the switches 144, 146 and configured to generate the DC termination voltage, $V_T$, for the switches 144, 146 in response to the DC supply voltage, $V_{DD}$, of the redriver. In some embodiments, to be compatible with USB standards, the receiver safe-mode resistive unit is not terminated to the DC supply voltage, $V_{DD}$, of the redriver. In some embodiments, the termination voltage is lower than the DC supply voltage, $V_{DD}$, of the redriver and is higher than a DC reference voltage such as the ground. The resistance value of the resistors 140, 142 may be around 45K ohms (e.g., within ±30% of 45K ohms). In some embodiments, the receiver safe-mode resistive unit includes one or more processors, such as digital state machines, microcontrollers or central processing units (CPUs) configured to control the switches.

In the embodiment depicted in FIG. 1, the receiver CMK circuit 110 includes two resistors 150, 152, two switches 154, 156, and two current sources 158, 160. The resistance value of the resistors 150, 152 may be around of 20K ohms (e.g., within ±30% of 20K ohms). In some embodiments, the receiver CMK circuit includes one or more processors, such as digital state machines, microcontrollers or CPUs configured to control the switches.

In the embodiment depicted in FIG. 1, the receiver resistive termination unit 106 is electrically connected to the CTLE 102 and to the input terminals 132-1, 132-2 of the redriver 100. The receiver resistive termination unit includes two resistors 162, 164 electrically connected to the input terminals 132-1, 132-2 of the redriver and two switches 166, 168 serially connected to the resistors respectively and to the DC supply voltage, $V_{DD}$, of the redriver. The resistance value of the resistors 162, 164 may be around of 50 ohms (e.g., within ±30% of 50 ohms). In some embodiments, the receiver resistive termination unit includes one or more processors, such as digital state machines, microcontrollers or CPUs configured to control the switches.

In the embodiment depicted in FIG. 1, the transmitter safe-mode resistive unit 118 is electrically connected to the transmitter driver 104 and to the output terminals 134-1, 134-2 of the redriver 100. In some embodiments, the transmitter safe-mode resistive unit is used to show a minimum impedance when the redriver is turned off. The transmitter safe-mode resistive unit includes two resistors 170, 172 electrically connected to the output terminals 134-1, 134-2 of the redriver, two switches 174, 176 serially connected to the resistors 170, 172, and a voltage regulator 178 electrically connected to the switches 174, 176 and configured to generate the DC termination voltage, $V_T$, for the switches 174, 176 in response to the DC supply voltage, $V_{DD}$, of the redriver. In some embodiments, to be compatible with USB standards, the receiver safe-mode resistive unit is not terminated to the DC supply voltage, $V_{DD}$, of the redriver. In some embodiments, the termination voltage, $V_T$, is lower than the DC supply voltage, $V_{DD}$, of the redriver and is higher than a DC reference voltage such as the ground. The resistance value of the resistors 170, 172 may be around of 45K ohms (e.g., within ±30% of 45K ohms). In some embodiments, the transmitter safe-mode resistive unit includes one or more processors, such as digital state machines, microcontrollers or CPUs configured to control the switches.

In the embodiment depicted in FIG. 1, the transmitter CMK circuit 120 includes two resistors 180, 182, two switches 184, 186, and two current sources 188, 190. The resistance value of the resistors 180, 182 may be around (e.g., within ±30%) of 25K ohms. In some embodiments, the transmitter CMK circuit includes one or more processors, such as digital state machines, microcontrollers or CPUs configured to control the switches.

In the embodiment depicted in FIG. 1, the transmitter resistive termination unit 116 is electrically connected to the transmitter driver 104 and to the output terminals 134-1, 134-2 of the redriver 100. The transmitter resistive termination unit includes two resistors 192, 194 electrically connected to the output terminals 134-1, 134-2 of the redriver and two switches 196, 198 serially connected to the resistors 192, 194 respectively and to the DC supply voltage, $V_{DD}$, of the redriver. The resistance value of the resistors 192, 194 may be around of 50 ohms (e.g., within ±30% of 50 ohms). In some embodiments, the transmitter resistive termination unit includes one or more processors, such as digital state machines, microcontrollers or CPUs configured to control the switches.

Figure 4:
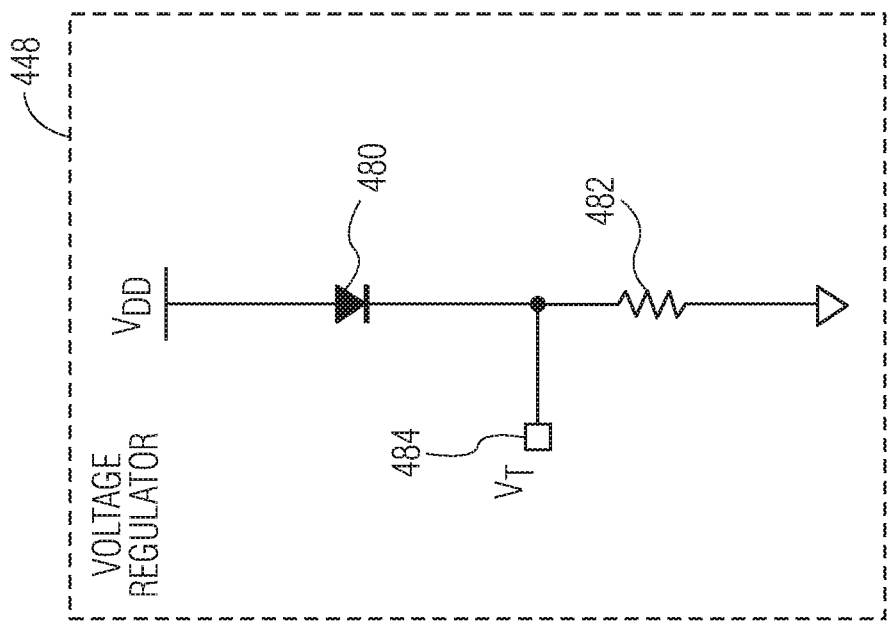
FIG. 4 depicts an embodiment of a voltage regulator of the redriver depicted in FIG. 1.

FIG. 4 depicts a voltage regulator 448, which is an embodiment of the voltage regulator 148 of the receiver safe-mode resistive unit 108 or the voltage regulator 178 of the transmitter safe-mode resistive unit 118 depicted in FIG. 1. However, the voltage regulators 148, 178 depicted in FIG. 1 are not limited to the embodiment shown in FIG. 4. In the embodiment depicted in FIG. 4, the voltage regulator includes a diode device 480 electrically connected to the DC supply voltage, $V_{DD}$, of the redriver, a resistor 482 electrically connected between the diode device and a DC reference voltage (e.g., ground), and a voltage output terminal 484 electrically connected to the diode device and to the resistor 482 and configured to output a DC termination voltage, $V_T$. The DC termination voltage, $V_T$, can be applied to the switches 144, 146 of the receiver safe-mode resistive unit 108 or the switches 174, 176 of the transmitter safe-mode resistive unit 118. In some embodiments, the DC reference voltage is zero volt. Compared to a complicated regulator, the voltage regulator depicted in FIG. 4 can be implemented in a small substrate area. In addition, compared to a complicated regulator, the voltage regulator depicted in FIG. 4 has a lower current consumption.

Figure 5:
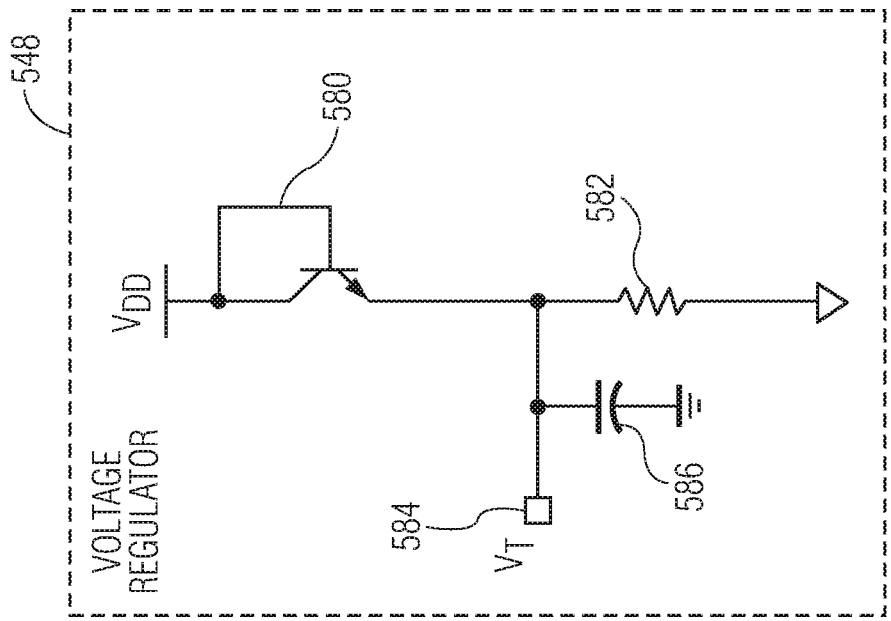
FIG. 5 depicts an embodiment of the voltage regulator depicted in FIG. 4.

In some embodiments, the diode device 480 of the voltage regulator 448 is implemented using a transistor. FIG. 5 depicts a voltage regulator 548, which is an embodiment of the voltage regulator 448 depicted in FIG. 4 that is implemented using an NPN transistor 580. However, the voltage regulators 448 depicted in FIG. 4 are not limited to the embodiment shown in FIG. 5. In the embodiment depicted in FIG. 5, the voltage regulator 548 includes the NPN transistor 580 electrically connected to the DC supply voltage, $V_{DD}$, of the redriver 100, a resistor 582 electrically connected between the NPN transistor 580 and a DC reference voltage (e.g., ground), a voltage output terminal 584 electrically connected to the NPN transistor 580 and to the resistor 528 and configured to output a DC termination voltage, $V_T$, and a capacitor 586 electrically connected to the NPN transistor 580, to the resistor 582, and to the voltage output terminal 584 configured to stabilize the DC termination voltage, $V_T$. The DC termination voltage, $V_T$, can be applied to the switches 144, 146 of the receiver safe-mode resistive unit 108 or the switches 174, 176 of the transmitter safe-mode resistive unit 118.

Figure 6:
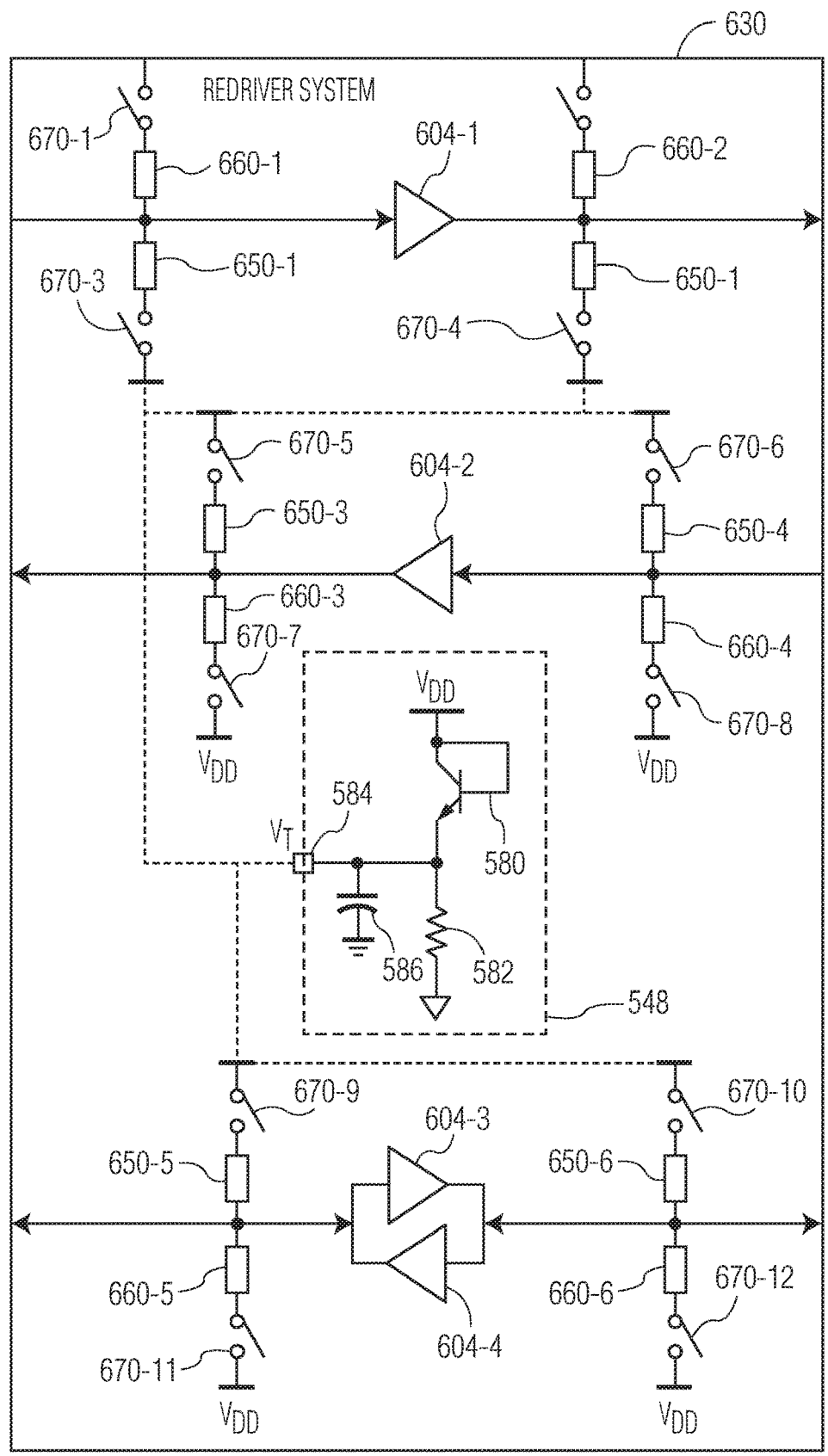
FIG. 6 depicts a redriver system in which the voltage regulator depicted in FIG. 5 is shared by multiple safe-mode resistors in accordance with an embodiment of the invention.

FIG. 6 depicts a redriver system 640 in which the voltage regulator depicted in FIG. 5 is shared by multiple safe-mode resistors 650-1, 650-2, 650-3, 650-4, 650-5, 650-6 in accordance with an embodiment of the invention. In the embodiment depicted in FIG. 6, the redriver system includes the voltage regulator 548 configured to generate a DC termination voltage, $V_T$, in response to the DC supply voltage, $V_{DD}$, of the redriver system, four transmitter drivers 604-1, 604-2, 604-3, 604-4, the safe-mode resistors 650-1, 650-2, 650-3, 650-4, 650-5, 650-6, six termination resistors 660-1, 660-2, 660-3, 660-4, 660-5, 660-6, and twelve switches 670-1, 670-2, 670-3, 670-4, 670-5, 670-6, 670-7, 670-8, 670-9, 670-10, 670-11, 670-12. In some embodiments, the DC termination voltage, $V_T$, is around (e.g., within ±30% of) 1.2 volt and the DC supply voltage, $V_{DD}$, of the redriver system is around (e.g., within ±10% of) 1.8 volt. The safe-mode resistors 650-1, 650-2, 650-3, 650-4, 650-5, 650-6 are embodiments of the safe-mode resistor 140, 142, 170, or 172 depicted in FIG. 1. The four transmitter drivers 604-1, 604-2, 604-3 are embodiments of the transmitter driver 104 depicted in FIG. 1. The termination resistors 660-1, 660-2, 660-3, 660-4, 660-5, 660-6 are embodiments of the termination resistor 162, 164, 192, or 194 depicted in FIG. 1. The switches 670-1, 670-2, 670-3, 670-4, 670-5, 670-6, 670-7, 670-8, 670-9, 670-10, 670-11, 670-12 are embodiments of the switch 144, 146, 166, 168, 174, 176, 196, or 198 depicted in FIG. 1. In the embodiment depicted in FIG. 6, the voltage regulator 548 is shared by the six safe-mode resistors 650-1, 650-2, 650-3, 650-4, 650-5, 650-6 and the DC termination voltage, $V_T$, generated by the voltage regulator is supplied to the six safe-mode resistors 650-1, 650-2, 650-3, 650-4, 650-5, 650-6. In some embodiments, the termination resistors 660-1, 660-2, 660-3, 660-4, 660-5, 660-6 have a resistance value of 50 ohm.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A resistive unit for a redriver, wherein the redriver includes an input terminal that is different from an output terminal of the redriver, the resistive unit comprising:
   at least one resistor having a first end connected to the input terminal or the output terminal of the redriver;
   at least one switch having a first end serially connected to a second end of the at least one resistor; and
   a voltage regulator connected to a second end of the at least one switch and configured to generate a termination voltage;
   wherein the voltage regulator is further configured to generate the termination voltage for the at least one switch in response to a supply voltage of the redriver.

2. The resistive unit of claim 1,
   wherein the termination voltage is lower than the supply voltage of the redriver and is higher than a reference voltage.

3. The resistive unit of claim 2,
   wherein the reference voltage is zero volts.

4. The resistive unit of claim 1, wherein the voltage regulator comprises:
   a diode device connected to a direct current (DC) voltage;
   a second resistor connected between the diode device and a reference voltage; and
   a voltage output terminal connected to the diode device and to the second resistor and configured to output the termination voltage to the at least one switch.

5. The resistive unit of claim 4,
   wherein the DC voltage is equal to a supply voltage of the redriver.

6. The resistive unit of claim 5,
   wherein the termination voltage is lower than the supply voltage of the redriver and is higher than the reference voltage.

7. The resistive unit of claim 4,
   wherein the reference voltage is zero volts.

8. The resistive unit of claim 4,
   further comprising a capacitor connected to the diode device, to the second resistor, and to the voltage output terminal.

9. The resistive unit of claim 4,
   wherein the diode device comprises a transistor.

10. A resistive unit for a redriver, wherein the redriver includes an input terminal that is different from an output terminal of the redriver, the resistive unit comprising:
    first and second resistors respectively connected to the input terminal and/or the output terminal of the redriver;
    first and second switches serially connected to the first and second resistors respectively; and
    a voltage regulator connected to the first and second switches and configured to generate a direct current (DC) termination voltage for the first and second switches in response to a DC supply voltage of the redriver,
    wherein the termination voltage is lower than the DC supply voltage of the redriver and is higher than a DC reference voltage.

11. The resistive unit of claim 10, wherein the voltage regulator comprises:
    a diode device connected to the DC supply voltage of the redriver;
    a third resistor connected between the diode device and the DC reference voltage; and
    a voltage output terminal connected to the diode device and to the third resistor and configured to output the DC termination voltage to the first and second switches.

12. The resistive unit of claim 11,
    wherein the DC reference voltage is zero volts.

13. The resistive unit of claim 11,
    further comprising a capacitor connected to the diode device, to the third resistor, and to the voltage output terminal.

14. The resistive unit of claim 11,
    wherein the diode device comprises a transistor.

15. A redriver, the redriver comprising:
    a Continuous Time Linear Equalizer (CTLE) configured to perform signal equalization;
    a transmitter driver configured to generate a driver signal in response to the signal equalization;
    a first resistive unit connected to the CTLE or to the transmitter driver and to an input/output terminal of the redriver, the first resistive unit comprising:
       first and second resistors connected to the input/output terminal of the redriver;

first and second switches serially connected to the first and second resistors respectively; and a voltage regulator connected to the first and second switches and configured to generate a direct current (DC) termination voltage for the first and second switches in response to a DC supply voltage of the redriver, wherein the termination voltage is lower than the DC supply voltage of the redriver and is higher than a DC reference voltage; and a second resistive unit connected to the CTLE or the transmitter driver and to the input/output terminal of the redriver, the second resistive unit comprising:

third and fourth resistors connected to the input/output terminal of the redriver; and third and fourth switches serially connected to the third and fourth resistors respectively and to the DC supply voltage of the redriver.

16. The redriver of claim 15, wherein the voltage regulator comprises:

a diode device connected to the DC supply voltage of the redriver;

a fifth resistor connected between the diode device and the DC reference voltage; and a voltage output terminal connected to the diode device and to the fifth resistor and configured to output the DC termination voltage to the first and second switches.

17. The redriver of claim 16, further comprising a capacitor connected to the diode device, to the fifth resistor, and to the voltage output terminal.

18. The redriver of claim 16, wherein the diode device comprises a transistor.

19. The redriver of claim 15, wherein the DC reference voltage is zero volts.

20. A resistive unit for a redriver, the resistive unit comprising:

at least one resistor connected to an input/output terminal of the redriver;

at least one switch serially connected to the at least one resistor; and a voltage regulator connected to the at least one switch and configured to generate a termination voltage for the at least one switch;

wherein the voltage regulator is further configured to generate the termination voltage for the at least one switch in response to a supply voltage of the redriver;

wherein the termination voltage is lower than the supply voltage of the redriver and is higher than a reference voltage; and wherein the reference voltage is zero volts.

* * * * *